US011257772B2

(12) United States Patent
Chen et al.

(10) Patent No.: US 11,257,772 B2
(45) Date of Patent: Feb. 22, 2022

(54) FAN-OUT ANTENNA PACKAGING STRUCTURE AND PREPARATION METHOD THEREOF

(71) Applicant: SJ SEMICONDUCTOR (JIANGYIN) CORPORATION, Jiang Yin (CN)

(72) Inventors: Yenheng Chen, Jiangyin (CN); Chengchung Lin, Jiangyin (CN); Jangshen Lin, Jiangyin (CN); Chengtar Wu, Jiangyin (CN); Chihon Ho, Jiangyin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 89 days.

(21) Appl. No.: 16/987,307

(22) Filed: Aug. 6, 2020

(65) Prior Publication Data
US 2020/0373262 A1 Nov. 26, 2020

Related U.S. Application Data

(62) Division of application No. 16/171,054, filed on Oct. 25, 2018, now Pat. No. 10,777,515.

(30) Foreign Application Priority Data

Oct. 25, 2017 (CN) .......................... 201711008673.1
Oct. 25, 2017 (CN) .......................... 201721385505.X (51) Int. Cl.
*H01L 23/495* (2006.01)
*H01L 23/66* (2006.01)
(Continued)

(52) U.S. Cl.
CPC ............ *H01L 23/66* (2013.01); *H01L 21/486* (2013.01); *H01L 21/4853* (2013.01);
(Continued)

(58) Field of Classification Search
CPC . H01L 21/486; H01L 21/568; H01L 21/4853; H01L 21/4857; H01L 23/66;
(Continued)

(56) References Cited

U.S. PATENT DOCUMENTS

2016/0329299 A1* 11/2016 Lin ..................... H01L 23/3128

* cited by examiner

*Primary Examiner* — Luan C Thai
(74) *Attorney, Agent, or Firm* — Alston & Bird LLP (57) ABSTRACT

The present disclosure provides a fan-out antenna packaging structure and a preparation method thereof. The fan-out antenna packaging structure comprises: a semiconductor chip; a plastic packaging material layer enclosing a periphery of the semiconductor chip, a via being formed in the plastic packaging material layer; a conductive pole located in the via and running through the plastic packaging material layer from top to bottom; an antenna structure located on a first surface of the plastic packaging material layer and electrically connected with the conductive pole; a redistribution layer located on a second surface of the plastic packaging material layer and electrically connected with the semiconductor chip and the conductive pole; and a solder bump located on a surface of the redistribution layer, electrically connected with the redistribution layer and insulated from the plastic packaging material layer.

9 Claims, 6 Drawing Sheets

(51) Int. Cl.
*H01L 23/31* (2006.01)
*H01L 23/48* (2006.01)
*H01L 23/498* (2006.01)
*H01L 21/48* (2006.01)
*H01Q 1/22* (2006.01)
*H01L 21/56* (2006.01)

(52) U.S. Cl.
CPC ........ *H01L 21/4857* (2013.01); *H01L 21/568* (2013.01); *H01L 23/3128* (2013.01); *H01L 23/481* (2013.01); *H01L 23/49816* (2013.01); *H01L 23/49822* (2013.01); *H01Q 1/2283* (2013.01); *H01L 2223/6677* (2013.01)

(58) Field of Classification Search
CPC ............... H01L 23/3128; H01L 23/481; H01L 23/49816; H01L 23/49822
USPC ........................................................ 257/668
See application file for complete search history.

FAN-OUT ANTENNA PACKAGING STRUCTURE AND PREPARATION METHOD THEREOF

CROSS REFERENCES TO RELATED APPLICATIONS

This application claims the benefit of priority to U.S. application Ser. No. 16/171,054 entitled "Fan-Out Antenna Packaging Structure and Preparation Method Thereof" filed at USPTO on Oct. 25, 2018, Chinese Patent Application No. CN2017110086731, entitled "Fan-Out Antenna Packaging Structure and Preparation Method Thereof", filed with SIPO on Oct. 25, 2017, and Chinese Patent Application No. CN201721385505X, entitled "Fan-Out Antenna Packaging Structure", filed with SIPO on Oct. 25, 2017, the contents of which are incorporated herein by reference in its entirety.

TECHNICAL FIELD

The present disclosure relates to the technical field of semiconductor packaging, and in particular to a fan-out antenna packaging structure and a method for preparation method thereof.

BACKGROUND

Circuits of lower-cost, more reliable, faster and higher-density are the goal pursued by integrated circuit packaging. In the future, integrated circuit packaging will increase the integration density of various electronic components by continuously reducing the minimum feature size. At present, advanced packaging methods include Wafer Level Chip Scale Packaging (WLCSP), Fan-Out Wafer Level Packaging (FOWLP), Flip Chip (Flip Chip), Package on Package (POP), and so on.

Fan-out wafer level packaging is an embedded chip packaging method based on wafer level processing, and it is one of the advanced packaging methods with more input/output (I/O) ports and better integration flexibility. Fan-out wafer level packaging has the following unique advantages over conventional wafer level packaging: 1) I/O spacing are flexible and it is independent of chip sizes; 2) only effective dies are used and the product yield can be improved; 3) the 3D packaging path is flexible and patterns in any array can be formed at the top; 4) the electrical and thermal performance is better; 5) it can be applied in high frequencies; and 6) it is easy to achieve high-density wiring in a redistribution layer (RDL).

At present, a fan-out wafer level packaging method of radio frequency chips generally comprises the following steps: providing a carrier and forming an adhesive layer on a surface of the carrier; obtaining a redistribution layer (RDL) on the adhesive layer by performing photo-etching and electroplating; mounting the radio frequency chip on the redistribution layer by adopting a chip bonding process; packaging the chip in a plastic packaging material layer by adopting an injection molding process; removing the carrier and the adhesive layer; forming an Under-Bump Metal (UBM) layer on the redistribution layer by performing photo-etching and electroplating; performing ball placement and reflow on the UBM layer to form a solder ball bump; and then performing wafer bonding and dicing. For the sake of communication effect, antennas will be provided when the radio frequency chip is used, and for the existing radio frequency chip, antennas are directly laid out on a PCB or interfaces for connecting external antennas are provided by developers when layout design is performed for radio frequency function modules. However, due to the inconvenience in connecting the external antennas, most of the existing antennas are laid out directly on the PCB, in order to ensure the antenna gain, the size of the antennas must be large enough, and this will inevitably be at the expense of the PCB area, such that the area of the PCB and the entire packaging structure will become larger.

In view of this, it is necessary to design a new fan-out antenna packaging structure and a preparation method thereof to solve the above-mentioned technical problems.

SUMMARY

The present disclosure provides a fan-out antenna packaging structure. The fan-out antenna packaging structure comprises: a semiconductor chip, a plastic packaging material layer comprising a first surface and a second surface opposite to the first surface, wherein the plastic packaging material layer encloses a periphery of the semiconductor chip and exposes a front surface of the semiconductor chip; a via being formed in the plastic packaging material layer and the via running through the plastic packaging material layer from top to bottom; a conductive pole filled into the via and running through the plastic packaging material layer from top to bottom; an antenna structure located on the first surface of the plastic packaging material layer and electrically connected with the conductive pole; a redistribution layer located on the second surface of the plastic packaging material layer and electrically connected with the semiconductor chip and the conductive pole; and a solder bump located on a surface of the redistribution layer, wherein the solder bump is electrically connected with the redistribution layer and insulated from the plastic packing material layer.

Preferably, the semiconductor chip comprises: a substrate, and a contact pad located on the substrate and electrically connected with the substrate, wherein a surface on which the contact pad is located is the front surface of the semiconductor chip.

Preferably, the conductive pole is wider on top than bottom.

Preferably, the antenna structure comprises a dielectric layer and metal antennas which are alternately stacked, and a top layer of the antenna structure is the metal antennas, and adjacent metal antennas, and the metal antennas and the conductive pole are electrically connected through a metal plug.

Preferably, the antenna structure comprises a layer of patterned metal antennas.

Preferably, the metal antennas have a shape of spiral rectangular.

Preferably, a number of the metal antennas is more than one, the more than one metal antennas is distributed in the plane of the dielectric layer.

Preferably, the redistribution layer comprises: an insulating layer located on the second surface of the plastic packaging material layer; one metal wire layer disposed in the insulating layer and electrically connected with the semiconductor chip and the conductive pole; and an under-bump metal layer located in the insulating layer, electrically connected with the metal wire layer and the solder bump, and insulated from the plastic packaging material layer.

The present disclosure further provides a method for preparing a fan-out antenna packaging structure. The method for preparing the fan-out antenna packaging structure comprises the following steps:

1) providing a carrier and forming a peeling layer on an upper surface of the carrier;
2) providing a semiconductor chip and mounting the semiconductor chip face-down on an upper surface of the peeling layer;
3) forming a plastic packaging material layer on the surface of the peeling layer, wherein the plastic packaging material layer encloses the semiconductor chip; wherein the plastic packaging material layer comprises a first surface and a second surface opposite to the first surface, and the second surface of the plastic packaging material layer is in contact with the peeling layer;
4) removing the carrier and the peeling layer;
5) forming a redistribution layer on the second surface of the plastic packaging material layer, the redistribution layer being electrically connected with the semiconductor chip;
6) forming a via in the plastic packaging material layer by adopting a drilling process, the via exposing part of the redistribution layer;
7) forming a conductive pole in the via, the conductive pole being electrically connected with the redistribution layer;
8) forming an antenna structure on the first surface of the plastic packaging material layer, the antenna structure being electrically connected with the conductive pole; and
9) forming a solder ball bump on a surface, insulated from the plastic packaging material layer, of the redistribution layer, the solder ball bump being electrically connected with the redistribution layer.

Preferably, step 8) of forming an antenna structure on the first surface of the plastic packaging material layer comprises the following steps:

8-1) forming a first dielectric layer on the first surface of the plastic packaging material layer;
8-2) forming a first opening in the first dielectric layer, the first opening exposing the upper surface of the conductive pole;
8-3) forming a first metal plug in the first opening and forming a first layer of metal antennas on an upper surface of the first dielectric layer, the first layer of metal antennas being electrically connected with the conductive pole through the first metal plug;
8-4) forming a second dielectric layer on the upper surface of the first dielectric layer on which the first layer of metal antennas are formed, the second dielectric layer completely covering the first layer of metal antennas;
8-5) forming a second opening in the second dielectric layer, the second opening exposing part of the first layer of metal antennas; and
8-6) forming a second metal plug in the second opening, and forming a second layer of metal antennas on the second dielectric layer.

Preferably, in step 8), a specific method for forming an antenna structure on the first surface of the plastic packaging material layer comprises: forming a layer of metal antennas on the first surface of the plastic packaging material layer as the antenna structure.

Preferably, the metal antennas have a shape of spiral rectangular.

Preferably, a number of the metal antennas is more than one, the more than one metal antennas are distributed in a plane of the dielectric layer.

DESCRIPTION OF COMPONENT REFERENCE SIGNS

| | |
|---|---|
| 10 | Carrier |
| 11 | Peeling layer |
| 12 | Semiconductor chip |
| 121 | Substrate |
| 122 | Contact pad |
| 13 | Plastic packaging material layer |
| 131 | via |
| 14 | Redistribution layer |
| 141 | Insulating layer |
| 142 | Metal wire layer |
| 143 | Under-bump metal layer |
| 15 | Conductive pole |
| 16 | Antenna structure |
| 161 | Dielectric layer |
| 1611 | First dielectric layer |
| 1612 | Second dielectric layer |
| 162 | Metal antenna |
| 163 | Metal plug |
| 1631 | First metal plug |
| 1632 | Second metal plug |
| 17 | Solder ball bump |
| 1)-9) | Steps |

DETAILED DESCRIPTION OF THE PREFERRED EMBODIMENTS

The implementation modes of the present disclosure will be described below through specific examples. One skilled in the art can easily understand other advantages and effects of the present disclosure according to content disclosed in the description.

Please refer to FIG. 1 to FIG. 14. It needs to be stated that the drawings provided in this embodiment are just used for schematically describing the basic concept of the present disclosure, thus only illustrate components only related to the present disclosure and are not drawn according to the numbers, shapes and sizes of components during actual implementation, the configuration, number and scale of each component during actual implementation thereof may be freely changed, and the component layout configuration thereof may be more complicated.

Embodiment 1

Figure 1:
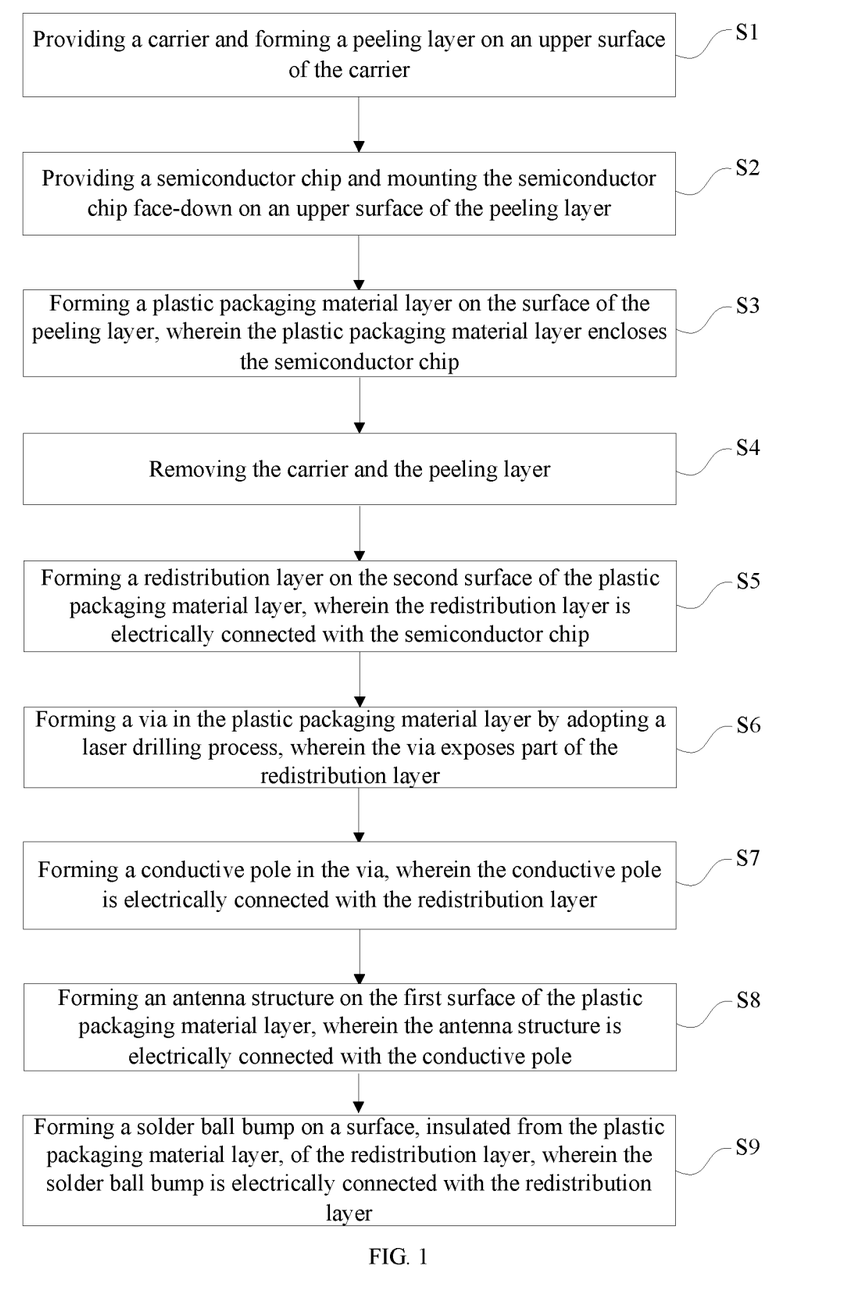
FIG. 1 illustrates a flowchart of a method for fabricating a fan-out antenna packaging structure provided in embodiment 1 of the present disclosure.

Referring to FIG. 1, the present disclosure provides a method for preparing a fan-out antenna packaging structure. The method comprises the following steps:

1) providing a carrier and forming a peeling layer on an upper surface of the carrier;
2) providing a semiconductor chip and mounting the semiconductor chip on a surface of the peeling layer with a front surface of the semiconductor chip facing downward;
3) forming a plastic packaging material layer on the surface of the peeling layer, the plastic packaging material layer packaging the semiconductor chip; and the plastic packaging material layer comprising a first surface and a second surface which are opposite to each other, and the second surface of the plastic packaging material layer is in contact with the peeling layer;

4) removing the carrier and the peeling layer;

5) forming a redistribution layer on the second surface of the plastic packaging material layer, the redistribution layer being electrically connected with the semiconductor chip;

6) forming a via in the plastic packaging material layer by adopting a punching process, the via exposing part of the redistribution layer;

7) forming a conductive pole in the via, the conductive pole being electrically connected with the redistribution layer;

8) forming an antenna structure on the first surface of the plastic packaging material layer, wherein the antenna structure is electrically connected with the conductive pole; and 9) forming a solder ball bump on a surface, insulated from the plastic packaging material layer, of the redistribution layer, wherein the solder ball bump is electrically connected with the redistribution layer.

Figure 2:
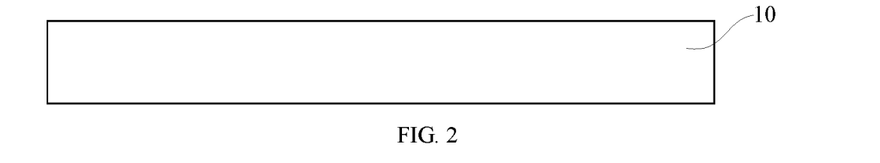
FIG. 2 to FIG. 11 are cross sectional views in each of the steps of a method for preparing a fan-out antenna packaging structure provided in embodiment 1 of the present disclosure.
Figure 3:
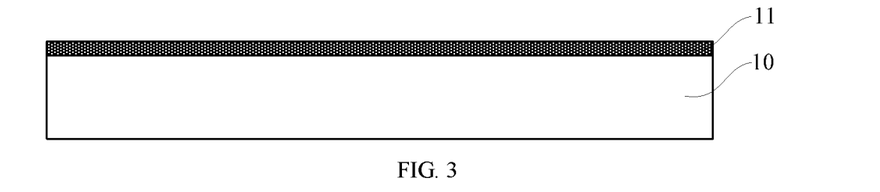

In step 1), please referring to step S1 in FIG. 1 and FIG. 2 to FIG. 3, a carrier 10 is provided and a peeling layer 11 is formed on an upper surface of the carrier 10.

As an example, as illustrated in FIG. 2, a material of the carrier 10 includes but is not limited to one of silicon, glass, silicon oxide, ceramics, polymer and metal, or a composite material of more than two kinds of material thereof, and the shape thereof may be a wafer shape, square shape or any other required shape. In this embodiment, the carrier 10 is used to prevent the semiconductor chip from being broken, warped and cracked during subsequent preparation.

As an example, as illustrated in FIG. 3, the peeling layer 11 acts as a separation layer between a subsequently formed redistribution layer 12 and other structures on the redistribution layer 122, and the carrier 10 in a subsequent process. The peeling layer 11 is preferably made of an adhesive material with a smooth surface, and it must have a certain binding force with the redistribution layer 12 to guarantee that the redistribution layer 122 will not move in the subsequent process. In addition, the peeling layer 11 also has a strong binding force with the carrier 10. Generally speaking, its binding force with the carrier 10 needs to be greater than that with the redistribution layer 122. As an example, the material of the peeling layer 11 is selected to be an adhesive tape with both sides having viscosity or adhesive made through a spin-coating process, etc. The adhesive tape is preferably a UV tape, which is easily torn off after exposure to UV light. In other implementation modes, the peeling layer 11 may be also selected to be any one of other material layers formed through physical vapor deposition or chemical vapor deposition, such as epoxy, silicone rubber, polyimide (PI), polybenzoxazole (PBO) and benzocyclobutene (BCB). When the carrier 10 is subsequently separated, the peeling layer 11 can be removed by means of wet etching, chemical mechanical polishing, tearing, etc.

Figure 4:
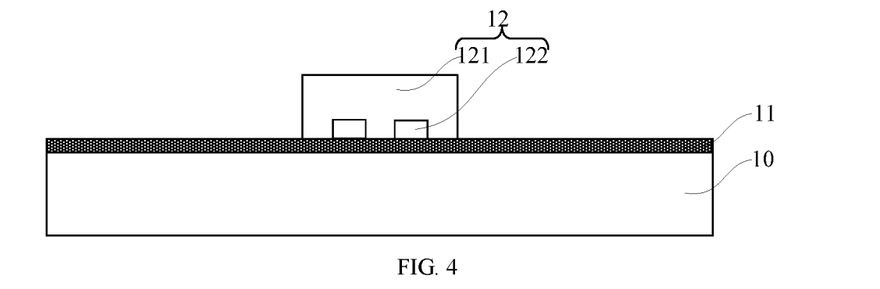

In step 2), please referring to step S2 in FIG. 1 and FIG. 4, a semiconductor chip 12 is provided and the semiconductor chip 12 is mounted on a surface of the peeling layer 11 with a front surface of the semiconductor chip 12 facing downward.

As an example, the semiconductor chip 12 may be any one of chips, such as a radio frequency chip. The semiconductor chip 12 comprises a substrate 121 and a contact pad 122, wherein the contact pad 122 is located on the substrate 121 and is electrically connected with the substrate 121; and wherein a surface on which the contact pad 122 is located is the front surface of the semiconductor chip 12.

It needs to be noted that the semiconductor chip 12 may be any one of existing radio frequency communication chips for transmitting and receiving communication information. The thickness of the semiconductor chip 12 may be set according to actual needs. Preferably, in this embodiment, the thickness of the semiconductor chip 12 may be, but not limited to, a range of 100 µm-200 µm.

As an example, the number of the semiconductor chips 12 may be set according to actual needs, and the number of the semiconductor chips 12 mounted on the peeling layer 11 may be one, two or more.

Figure 5:
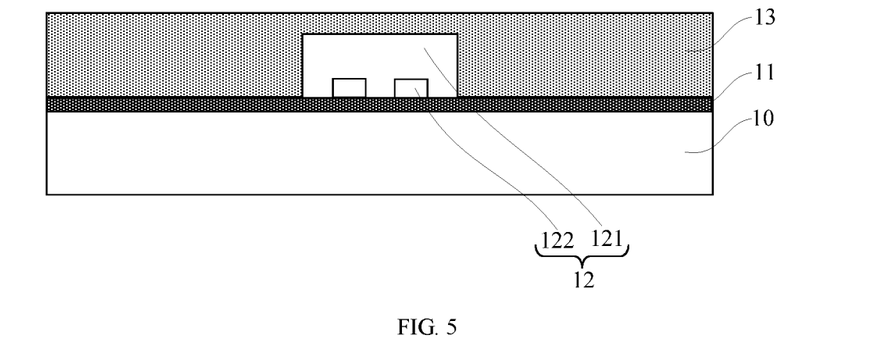

In step 3), please referring to step S3 in FIG. 1 and FIG. 5, a plastic packaging material layer 13 is formed on the surface of the peeling layer 15, and the plastic packaging material layer 13 packages the semiconductor chip 10; and the plastic packaging material layer 13 comprises a first surface and a second surface which are opposite to each other, and the second surface of the plastic packaging material layer 13 is in contact with the peeling layer 11.

As an example, the plastic packaging material layer 13 may be formed on the upper surface of the peeling layer 11 by adopting a compression molding, transfer molding, liquid seal molding, molding underfill, capillary underfill, vacuum laminating or spin coating process. Preferably, in this embodiment, the plastic packaging material layer 13 is formed on the upper surface of the peeling layer 11 by adopting the molding underfill process.

As an example, the material of the plastic packaging material layer 13 may be, but is not limited to, a polyimide layer, a silica gel layer, an epoxy resin layer, a curable polymer-based material layer, or a curable resin-based material layer.

As an example, the upper surface of the plastic wrapping material layer 13 may be higher than the back surface of the semiconductor chip 12 (that is, the plastic packaging material layer 13 packages the semiconductor chip 12) or may be level with the back surface of the semiconductor chip 12.

Figure 6:
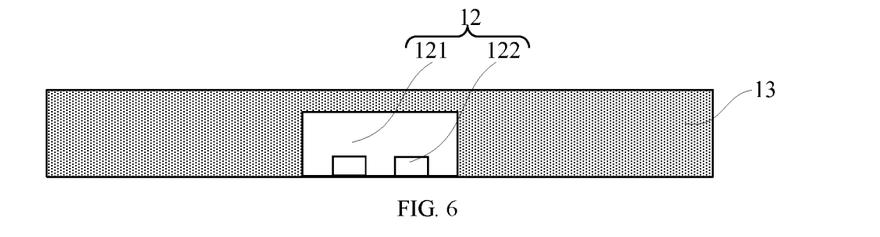

In step 4), please referring to step S4 in FIG. 1 and FIG. 6, the carrier 10 and the peeling layer 11 are removed.

As an example, the carrier 10 and the peeling layer 11 may be removed by adopting a grinding process, a thinning process, etc. Preferably, in this embodiment, the carrier 10 is removed by tearing off the peeling layer 11.

Figure 7:
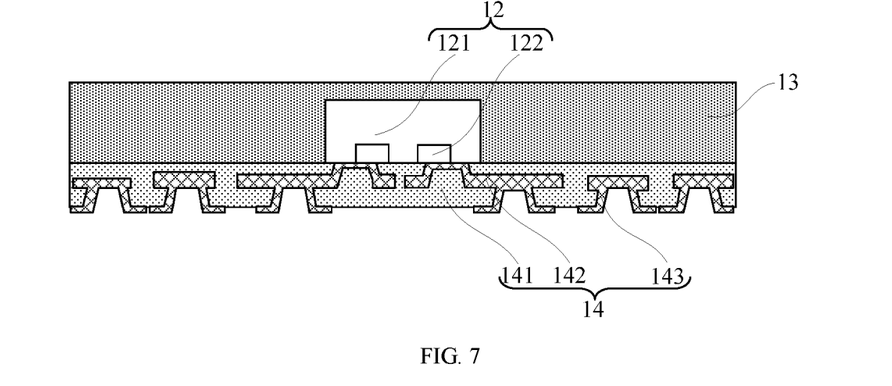

In step 5), please referring to step S5 in FIG. 1 and FIG. 7, a redistribution layer 13 is formed on the second surface of the plastic packaging material layer 13, and the redistribution layer 14 is electrically connected with the semiconductor chip 12.

In one example, the redistribution layer 14 comprises an insulating layer and a metal wire layer, and the step of forming the redistribution layer 14 on the second surface of the plastic packaging material layer 13 comprises the following steps:

5-1) forming the metal wire layer on the second surface of the plastic packaging material layer 13; and 5-2) forming an insulating layer on the upper surface of the plastic packaging material layer 13, the insulating layer wrapping the metal wire layer.

In another example, the redistribution layer 14 comprises an insulating layer and a metal wire layer, and the step of forming the redistribution layer 14 on the second surface of the plastic packaging material layer 13 comprises the following steps:

5-1) forming the insulating layer on the second surface of the plastic packaging material layer, and forming a via in the insulating layer through photo-etching and etching processes, the via defining the shape of the metal wire layer; and 5-2) forming the metal wire layer in the via hole.

In another example, as illustrated in FIG. 7, the redistribution layer 14 comprises a metal wire layer 142, at least one insulating layer 141, and an under-bump metal layer 143, and the step of forming the redistribution layer 14 on the second surface of the plastic packaging material layer 13 comprises the following steps:

5-1) forming the metal wire layer 142 on the second surface of the plastic packaging material layer 13, the metal wire layer 142 being electrically connected with the semiconductor chip 12;

5-2) forming the insulating layer 141 on the second surface of the plastic packaging material layer 13, the insulating layer 141 wrapping the metal wire layer 142 and the upper surface of the insulating layer 141 being higher than the upper surface of the metal wire layer 142;

5-3) forming an opening in the insulating layer 141, the opening exposing part of the metal wire layer 142; and 5-4) forming the under-bump metal layer 143 in the opening.

In another example, as illustrated in FIG. 7, the redistribution layer 14 comprises a metal wire layer 142, at least one insulating layer 141, and an under-bump metal layer 143, and the step of forming the redistribution layer 14 on the second surface of the plastic packaging material layer 13 comprises the following steps:

5-1) forming a first insulating layer 141 on the second surface of the plastic packaging material layer 13;

5-2) forming a first opening in the first insulating layer 141, the first opening exposing the connecting pad 122 of the semiconductor chip 12;

5-3) forming the metal wire layer 142 in the first opening;

5-4) forming a second insulating layer 141 on the upper surface of the first insulating layer 141;

5-5) forming a second opening in the second insulating layer 141, the second opening exposing the metal wire layer 142; and 5-6) forming the under-bump metal layer 143 in the second opening.

As an example, in the above-mentioned example, the material of the metal wire layer 142 may be, but is not limited to, one or a composite material of more than two of copper, aluminum, nickel, gold, silver and titanium, and the metal wire layer 142 may be formed by adopting a process such as PVD, CVD, sputtering, electroplating or electroless plating. The material of the insulating layer 141 may be a low k dielectric material. Specifically, the material of the insulating layer 141 may include one of epoxy resin, silica gel, PI, PBO, BCB, silica, phosphorus silica glass and fluorine glass, and the insulating layer 141 may be formed by adopting processes such as spin coating, CVD and plasma enhanced PECVD.

Figure 8:
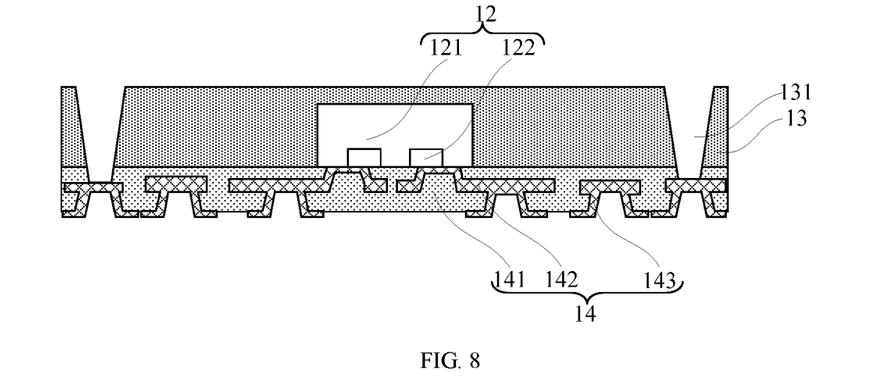

In step 6), please referring to step S6 in FIG. 1 and FIG. 8, a via 131 is formed in the plastic packaging material layer 13 by adopting a punching process, thus produced via holes are named via, and the via 131 exposes part of the redistribution layer 14.

As an example, in this embodiment, the via 131 may be formed in the plastic packaging material layer 13 by etching the plastic packaging material layer 13 by adopting a punching process, and of course, in other examples, the via 131 may also be formed in the plastic packaging material layer 13 by adopting an etching process, etc.

As an example, the shape of the cross section of the via 131 may be set according to actual needs. Preferably, in this embodiment, the shape of the cross section of the via 131 may be an inverted trapezoid, and of course, in other examples, the shape of the via 131 may also be a rectangle, etc.

It needs to be noted that, when the metal wire layer 142 in the redistribution layer 14 corresponding to the position of the via 131 is not exposed to the surface of the insulating layer 141 adjacent to the second surface of the plastic packaging material layer 13, the via 131 runs through the plastic packaging material layer 13 and then needs to extend into the insulating layer 141 of the redistribution layer, so as to ensure that the via 131 can expose part of the metal wire layer 142.

Figure 9:
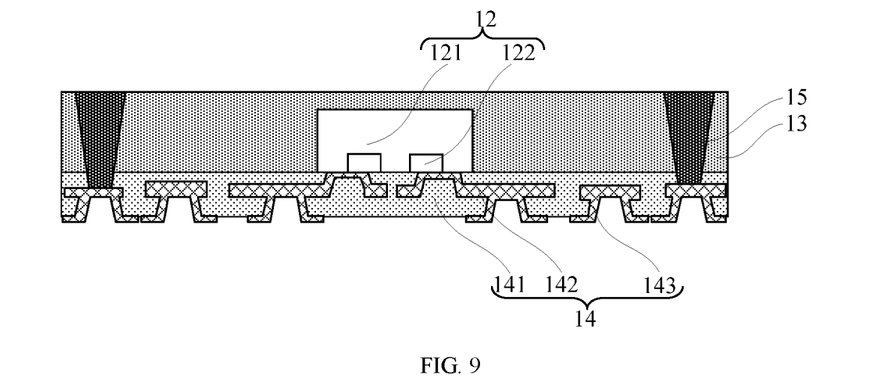

In step 7), please referring to step S7 in FIG. 1 and FIG. 9, a conductive pole 15 is formed in the via 131, and the conductive pole 15 is electrically connected with the redistribution layer 14.

As an example, a conductive adhesive printing process may be adopted to spin-coat the conductive adhesive on the first surface of the plastic packaging material layer 13 such that the conductive adhesive enters the via 131 to form the conductive pole 15. Of course, in other examples, conductive materials (e.g., metals, metal compounds, etc.) may also be deposited within the via 131 by adopting physical vapor deposition, chemical vapor deposition (CVD), plasma enhanced CVD and the like to form the conductive pole 15.

As an example, the upper surface of the conductive pole 15 is level with the first surface of the plastic packaging material layer 13.

In step 8), please referring to step S8 in FIG. 1 and FIG. 10 to FIG. 12, an antenna structure 16 is formed on the first surface of the plastic packaging material layer 13, and the antenna structure 16 is electrically connected with the conductive pole 15.

Figure 10:
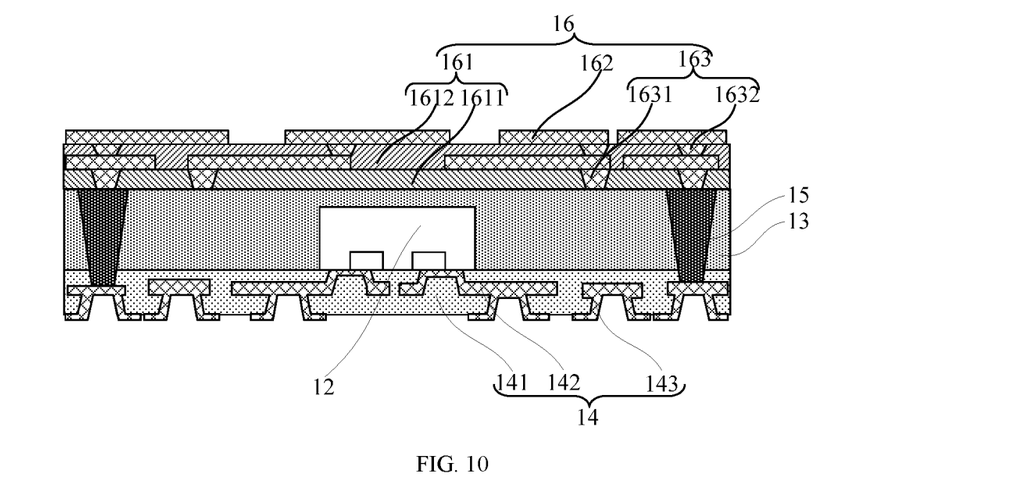

In one example, as illustrated in FIG. 10, the step of forming an antenna structure 16 on the first surface of the plastic packaging material layer 13 comprises the following steps:

8-1) forming a first dielectric layer 1611 on the first surface of the plastic packaging material layer 13;

8-2) forming a first opening (not shown) in the first dielectric layer 1611, the first opening exposing the upper surface of the conductive pole 15;

8-3) forming a first metal plug 1631 in the first opening and forming a first layer of metal antennas 162 on an upper surface of the first dielectric layer 1611, the first layer of metal antennas 162 being electrically connected with the conductive pole 15 through the first metal plug 1611;

8-4) forming a second dielectric layer 1612 on the upper surface of the first dielectric layer 1611 on which the first layer of metal antennas 162 are formed, the second dielectric layer 1612 completely covering the first layer of metal antennas 162; and the first dielectric layer 1611 and the second dielectric layer 1612 jointly forming the dielectric layer 161;

8-5) forming a second opening (not shown) in the second dielectric layer 1612, the second opening exposing part of the first layer of metal antennas 162; and 8-6) forming a second metal plug 1632 in the second opening and forming a second layer of metal antennas 162 on the second dielectric layer 1612; the first metal plug 1631 and the second metal plug 1632 jointly forming the metal plug 163.

Figure 11:
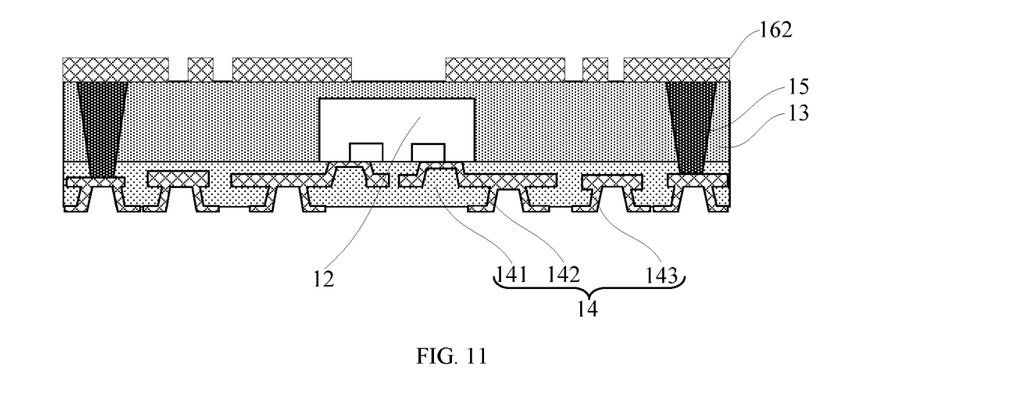

In another example, as illustrated in FIG. 11, a layer of metal antennas 162 may also be formed on the first surface of the plastic packaging material layer 15 as the antenna structure 16.

As an example, the shape of the metal antenna 162 may be set according to actual needs. Preferably, in this embodiment, the metal antennas 162 may be, but not limited to, spirally rectangular, as illustrated in FIG. 11. Of course, in other examples, the metal antennas 162 may also be in any other shapes, such as spirally circular shape or bow shape.

As an example, the material of the dielectric layer 161 may include, but not limited to, silicon dioxide or PET (polyethylene terephthalate), and is prepared by adopting processes such as spin coating, chemical vapor deposition (CVD) and plasma enhanced CVD. The material of the metal antennas 162 and the metal plug 163 may include, but not limited to, one or more of copper, aluminum, nickel, gold, silver, tin, and titanium, wherein the metal antennas 162 and the metal plug 163 may be prepared by adopting one of physical vapor deposition (PVD), chemical vapor deposition (CVD), sputtering, electroplating, and electroless plating.

As an example, the thickness of the first dielectric layer 1611 may be, but not limited to, 10 μm-15 μm, the thickness of the second dielectric layer 1612 may be, but not limited to, 10 μm-15 μm, and the thickness of the metal antennas 162 may be 5 μm-10 μm.

Figure 12:
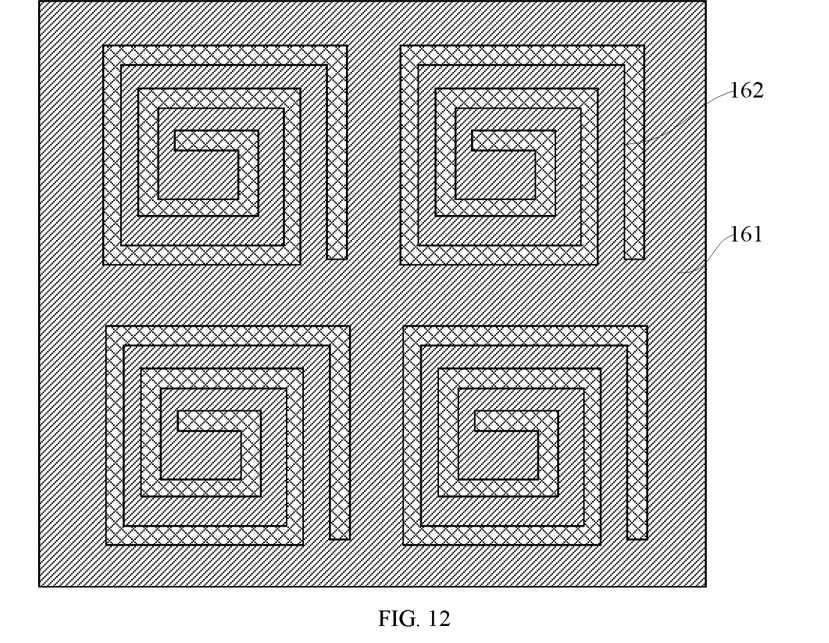
FIG. 12 is a top s view of the structures in FIG. 10 and FIG. 11.

As an example, the number of the metal antennas 162 on each layer may be set according to actual needs. Preferably, in this embodiment, the number of the metal antennas 162 on each layer is more than one, and the more than one metal antennas 162 are distributed in an array along an extending direction of the surface of the dielectric layer 161, wherein FIG. 12 illustrates an example that the number of the metal antenna 162 is four. Of course, in other examples, the number of the metal antennas 162 on each layer may also be set to one, two, three, five or more, and so on, according to actual needs. It needs to be noted that, in other examples, the number of the metal antennas 162 on the first layer may be the same as that on the second layer, or different from the number of the metal antennas 162 on the second layer, for example, the number of the metal antennas 162 on the first layer and the number of the metal antennas 162 on the second layer may be four, or the number of the metal antennas 162 on the first layer is one, the number of the metal antennas 162 on the second layer is four, and so on.

It needs to be further noted that, when the number of the semiconductor chip 12 is one, one metal antenna 162 corresponding thereto from top to bottom may be provided on each layer of metal antennas 162 above the semiconductor chip 12, and more than one metal antennas 162 may also be provided on each layer of metal antennas 162 above the semiconductor chip 12; when the number of the semiconductor chips 12 is two or more, one metal antenna 162 may be provided on each layer of the metal antennas 162 above the semiconductor chip 12, more than one metal antennas 162 may also be provided on each layer of metal antennas 162 above the semiconductor chip 12, and the metal antennas 162 on each layer of metal antennas 162 are provided corresponding to the semiconductor chips 12 one to one from top to bottom.

Figure 13:
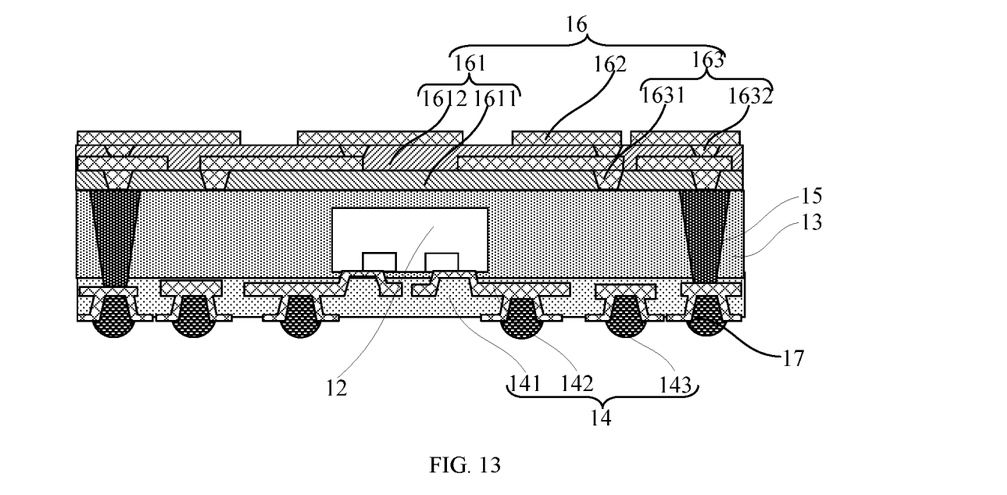
FIG. 13 and FIG. 14 illustrate cross sectional views of a fan-out antenna structure provided by the present disclosure.
Figure 14:
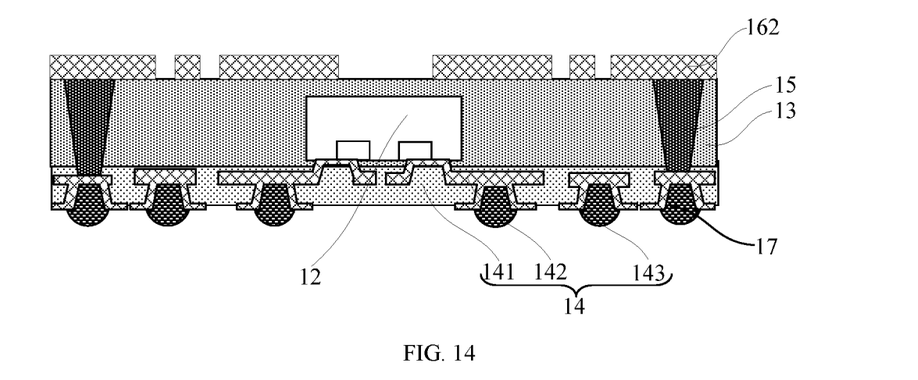

In step 9), please referring to step S9 in FIG. 1 and FIG. 13 and FIG. 14, a solder ball bump 17 is formed on a surface, insulated from the plastic packaging material layer 13, of the redistribution layer 14, and the solder ball bump 17 is electrically connected with the redistribution layer 14.

In one example, the step of forming a solder ball bump 17 on a surface, insulated from the plastic packaging material layer 13, of the redistribution layer 14 comprises the following steps:

9-1) forming a metal pole (not shown) on the surface, insulated from the plastic packaging material layer 13, of the redistribution layer 14, the metal pole being electrically connected with the metal wire layer 142 in the redistribution layer 14; and 9-2) forming a solder ball on the surface, insulated from the rewiring layer 14, of the metal pole.

As an example, the material of the metal pole may be one or a composite material of two or more than two of copper, aluminum, nickel, gold, silver and titanium, and the metal pole may be formed by adopting any one of processes such as physical vapor deposition (PVD), chemical vapor deposition (CVD), sputtering, electroplating and electroless plating. The material of the sold ball may be one or a composite material of two or more than two of copper, aluminum, nickel, gold, silver and titanium, and the sold ball may be formed by adopting a ball placement and reflow process.

In another example, as illustrated in FIGS. 13 and 14, the solder ball bump 17 is a solder ball, which can be directly formed as the solder ball bump 17 by adopting a ball placement and reflow process. The solder ball bump 17 is directly connected with the metal wire layer 142 in the redistribution layer 14. As an example, the height of the solder ball bump 17 may be, but not limited to, 190 μm.

Embodiment 2

Please continuously refer to FIG. 13 and FIG. 14. This embodiment provides a fan-out antenna packaging structure. The fan-out antenna packaging structure comprises: a semiconductor chip 12; a plastic packaging material layer 13 comprising a first surface and a second surface which are opposite to each other, the plastic packaging material layer 13 packaging a periphery of the semiconductor chip 12 and exposing a front surface of the semiconductor chip 12; a via 131 being formed in the plastic packaging material layer 13 and the via 131 running through the plastic packaging material layer 13 from top to bottom; a conductive pole 15 filled into the via 131 and running through the plastic packaging material layer 13 from top to bottom; an antenna structure 16 located on the first surface of the plastic packaging material layer 13 and electrically connected with the conductive pole 15; a redistribution layer 14 located on the second surface of the plastic packaging material layer 13 and electrically connected with the semiconductor chip 12 and the conductive pole 15; and a solder bump 17 located on a surface, insulated from the plastic packaging material layer 13, of the redistribution layer 14, and electrically connected with the redistribution layer 14.

As an example, the semiconductor chip 12 may be any chip, such as a radio frequency chip. The semiconductor chip 12 comprises a substrate 121 and a contact pad 122, wherein the contact pad 122 is located on the substrate 121 and is electrically connected with the substrate 121, wherein a surface on which the contact pad 122 is located is the front surface of the semiconductor chip 12.

It needs to be noted that the semiconductor chip 12 may be any one of existing radio frequency communication chips for transmitting and receiving communication information. The thickness of the semiconductor chip 12 may be set according to actual needs. Preferably, in this embodiment, the thickness of the semiconductor chip 12 may be, but not limited to, 100 μm-200 μm.

As an example, the number of the semiconductor chips 12 may be set according to actual needs, and the number of the semiconductor chips 12 mounted on the peeling layer 11 may be one, two or more.

As an example, the material of the plastic packaging material layer 13 may be, but is not limited to, a polyimide layer, a silica gel layer, an epoxy resin layer, a curable polymer-based material layer, or a curable resin-based material layer.

As an example, the shape of the cross section of the conductive pole 15 may be set according to actual needs. Preferably, in this embodiment, the shape of the cross section of the conductive pole 15 may be an inverted trapezoid, and of course, in other examples, the shape of the conductive pole 15 may also be a rectangle, etc.

As an example, the material of the conductive pole 15 may be a conductive adhesive, a conductive metal or a metal compound, etc.

As an example, the upper surface of the conductive pole 15 is level with the first surface of the plastic packaging material layer 13.

In one example, as illustrated in FIG. 13, the antenna structure 16 comprises a dielectric layer 161 and metal antennas 162 which are alternately stacked, and a top layer of the antenna structure 16 is the metal antennas 162, and adjacent metal antennas 162, and the metal antennas 162 and the metal connecting wire 162 are electrically connected through a metal plug 163. Herein, FIG. 12 illustrates an example that the dielectric layer 161 is divided into two layers (in other words, comprising a first dielectric layer 1611 and a second dielectric layer 1622 in FIG. 13), and the metal antennas 162 also comprise two layers.

In another example, as illustrated in FIG. 14, the antenna structure 16 may also comprise only one layer of metal antennas 162.

As an example, the shape of the metal antenna 162 may be set according to actual needs. Preferably, in this embodiment, the metal antennas 162 may be, but not limited to, spirally rectangular. Of course, in other examples, the metal antennas 162 may also be in any other shapes, such as spirally circular shape or bow shape.

As an example, the material of the dielectric layer 161 may include, but not limited to, silicon dioxide or PET (polyethylene terephthalate), and is prepared by adopting processes such as spin coating, chemical vapor deposition (CVD) and plasma enhanced chemical vapor deposition (PECVD). The material of the metal antennas 162 and the metal plug 163 may include, but not limited to, one or more of copper, aluminum, nickel, gold, silver, tin, and titanium, wherein the metal antennas 162 and the metal plug 163 may be prepared by adopting one of physical vapor deposition (PVD), chemical vapor deposition (CVD), sputtering, electroplating, and electroless plating.

As an example, the thickness of the first dielectric layer 1611 may be, but not limited to, 10 μm-15 μm, the thickness of the second dielectric layer 1612 may be, but not limited to, 10 μm-15 μm, and the thickness of the metal antennas 162 may be 5 μm-10 μm.

As an example, the number of the metal antennas 162 on each layer may be set according to actual needs. Preferably, in this embodiment, the number of the metal antennas 162 on each layer is more than one, and the more than one metal antennas 162 are distributed in an array along an extending direction of the surface of the dielectric layer 161, wherein FIG. 12 illustrates an example that the number of the metal antenna 162 is four. Of course, in other examples, the number of the metal antennas 162 on each layer may also be set to one, two, three, five or more, and so on, according to actual needs. It needs to be noted that, in other examples, the number of the metal antennas 162 on the first layer may be the same as that on the second layer, or different from the number of the metal antennas 162 on the second layer, for example, the number of the metal antennas 162 on the first layer and the number of the metal antennas 162 on the second layer may be four, or the number of the metal antennas 162 on the first layer is one, the number of the metal antennas 162 on the second layer is four, and so on.

It needs to be further noted that, when the number of the semiconductor chip 12 is one, one metal antenna 162 corresponding thereto from top to bottom may be provided on each layer of metal antennas 162 above the semiconductor chip 12, and more than one metal antennas 162 may also be provided on each layer of metal antennas 162 above the semiconductor chip 12; when the number of the semiconductor chips 12 is two or more, one metal antenna 162 may be provided on each layer of the metal antennas 162 above the semiconductor chip 12, more than one metal antennas 162 may also be provided on each layer of metal antennas 162 above the semiconductor chip 12, and the metal antennas 162 on each layer of metal antennas 162 are provided corresponding to the semiconductor chips 12 one to one from top to bottom.

According to the present utility model, by forming the antenna structure 16 on the first surface of the plastic packaging material layer 13, the antenna structure 16 is located above the semiconductor chip 12, thus the space area can be greatly reduced and the size of the packaging structure can be smaller; the metal antennas 162 in the antenna structure 16 adopt a stack and spiral structure, antennas with large area and length can be formed in a small area, the antenna gain is greatly improved, and not only can the stability of the radio frequency chip be guaranteed, but also the communication distance is improved; the metal antennas 162 in the antenna structure 16 may be prepared by adopting a dry etching process, the antenna width thereof can be very small, and the density of the metal antennas 162 in the antenna structure 16 can be greatly increased; and the packaging structure provided by the present utility model has better integration.

As an example, the redistribution layer 14 comprises: an insulating layer 141 located on the second surface of the plastic packaging material layer 13; at least one metal wire layer 142 located in the insulating layer 141 and electrically connected with the semiconductor chip 12 and the conductive pole 15; and an under-bump metal layer 143 located in the insulating layer 142 and a surface, insulated from the plastic packaging material layer 13, of the insulating layer 141, and electrically connected with the metal wire layer 142 and the solder bump 17. As an example, the height of the solder ball bump 17 may be, but not limited to, 190 μm.

To sum up, the present disclosure provides a fan-out antenna packaging structure and a preparation method thereof. The fan-out antenna packaging structure comprises: a semiconductor chip; a plastic packaging material layer comprising a first surface and a second surface which are opposite to each other, the plastic packaging material layer packaging a periphery of the semiconductor chip and exposing a front surface of the semiconductor chip; a via being formed in the plastic packaging material layer and the via running through the plastic packaging material layer from top to bottom; a conductive pole filled into the via and running through the plastic packaging material layer from top to bottom; an antenna structure located on the first surface of the plastic packaging material layer and electrically connected with the conductive pole; a redistribution layer located on the second surface of the plastic packaging material layer and electrically connected with the semiconductor chip and the conductive pole; and a solder bump located on a surface, insulated from the plastic packaging material layer, of the redistribution layer, and electrically connected with the redistribution layer. In the present disclosure, by forming the antenna structure on the first surface of the plastic packaging material layer, the antenna structure is located above the semiconductor chip, thus the space area can be greatly reduced and the size of the packaging structure can be smaller; the metal antennas in the antenna structure in the present disclosure adopt a stack and spiral structure, antennas with large area and length can be formed in a small area, the antenna gain is greatly improved, and not only can the stability of the radio frequency chip be guaranteed, but also the communication distance is improved; the antenna width of the metal antennas in the antenna structure can be very small, and the density of the metal antennas in the antenna structure can be greatly increased; the packaging structure provided by the present disclosure has better integration; and by forming the antennas in the packaging structure of the radio frequency chip in the present disclosure, it is unnecessary to lay out the antennas in the subsequent application, the problem that the area of the PCB is increased in order to ensure the antenna gain when the existing radio frequency chip is used is solved, and not only can the antenna gain of the radio frequency chip be guaranteed to be large enough, but also the area of the PCB board is guaranteed to be small enough.

The above-mentioned embodiments are only used for exemplarily describing the principle and effects of the present disclosure instead of limiting the present disclosure. One skilled in the art may make modifications or changes to the above-mentioned embodiments without departing from the spirit and scope of the present disclosure. Therefore, all equivalent modifications or changes made by those who have common knowledge in the art without departing from the spirit and technical thought disclosed by the present disclosure shall be still covered by the claims of the present disclosure.

What is claimed is:

1. A fan-out antenna packaging structure, comprising:
   a semiconductor chip;
   a plastic packaging material layer comprising a first surface and a second surface which are opposite to each other, wherein the plastic packaging material layer encloses a periphery of the semiconductor chip and exposes a front surface of the semiconductor chip;
   a via being formed in the plastic packaging material layer and the via running through the plastic packaging material layer from top to bottom;
   a conductive pole filled into the via and running through the plastic packaging material layer from top to bottom;
   an antenna structure located on the first surface of the plastic packaging material layer and electrically connected with the conductive pole;
   an insulating layer disposed on the second surface of the plastic packaging material layer, wherein the front surface of the semiconductor chip is in the same plane as one surface of the insulation layer;
   a redistribution layer disposed in the insulation layer, wherein the redistribution layer comprises a first type of metal wire layer, a second type of metal wire layer, and a under-bump metal layer, wherein the first type of metal wire layer is in direct contact with the front surface of the semiconductor chip;
   and
   a solder bump located on a surface of the redistribution layer, where in the solder bump is electrically connected with the redistribution layer and insulated from the plastic packaging material layer.

2. The fan-out antenna packaging structure according to claim 1, characterized in that the semiconductor chip comprises:
   a substrate; and
   a contact pad located on the substrate and electrically connected with the substrate, wherein a surface on which the contact pad is located is the front surface of the semiconductor chip.

3. The fan-out antenna packaging structure according to claim 1, characterized in that the conductive pole is wider on top than bottom.

4. The fan-out antenna packaging structure according to claim 1, characterized in that the antenna structure comprises a dielectric layer and metal antennas which are alternately stacked, wherein a top layer of the antenna structure is the metal antennas, both the adjacent metal antennas, and the metal antennas and the conductive pole are electrically connected through a metal plug.

5. The fan-out antenna packaging structure according to claim 1, characterized in that the antenna structure comprises a layer of patterned metal antennas.

6. The fan-out antenna packaging structure according to claim 4, characterized in that the metal antennas have a shape of a spiral rectangular.

7. The fan-out antenna packaging structure according to claim 5, characterized in that the metal antennas have a shape of a spiral rectangular.

8. The fan-out antenna packaging structure according to claim 5, characterized in that a number of the metal antennas is more than one, the more than one metal antennas is distributed in the plane of the dielectric layer.

9. The fan-out antenna packaging structure according to claim 1, wherein the redistribution layer comprises:
   one metal wire layer disposed in the insulating layer and electrically connected with the semiconductor chip and the conductive pole; and
   an under-bump metal layer located in the insulating layer, electrically connected with the metal wire layer and the solder bump, and insulated from the plastic packaging material layer.

* * * * *